United States Patent
Shirakawa et al.

(10) Patent No.: US 11,815,563 B2
(45) Date of Patent: Nov. 14, 2023

(54) MULTICORE CABLE INSPECTION METHOD AND MULTICORE CABLE INSPECTION DEVICE

(71) Applicant: Hitachi Metals, Ltd., Tokyo (JP)

(72) Inventors: Yohei Shirakawa, Tokyo (JP); Yoshitake Ageishi, Tokyo (JP)

(73) Assignee: Proterial, Ltd., Tokyo (JP)

( * ) Notice: Subject to any disclaimer, the term of this patent is extended or adjusted under 35 U.S.C. 154(b) by 163 days.

(21) Appl. No.: 17/171,039

(22) Filed: Feb. 9, 2021

(65) Prior Publication Data
US 2021/0263112 A1 Aug. 26, 2021

(30) Foreign Application Priority Data

Feb. 20, 2020 (JP) .................................. 2020-027315

(51) Int. Cl.
*H01B 13/06* (2006.01)
*G01R 31/60* (2020.01)
(Continued)

(52) U.S. Cl.
CPC ........... *G01R 31/60* (2020.01); *G01R 19/165* (2013.01); *H01B 13/067* (2013.01); *H01B 13/22* (2013.01); *H01R 43/28* (2013.01)

(58) Field of Classification Search
CPC ...... G01R 31/60; G01R 31/50; G01R 19/165; G01R 19/10; G01R 19/04; G01R 19/0038;
(Continued)

(56) References Cited

U.S. PATENT DOCUMENTS 4,998,059 A * 3/1991 Nigon ..................... G01R 31/60
324/67
5,577,099 A * 11/1996 Clement ................. G01R 31/60
379/22
(Continued)

FOREIGN PATENT DOCUMENTS

CN 105021885 A * 11/2015
GB 2297170 A * 7/1996 ........... G01R 31/023
(Continued)

OTHER PUBLICATIONS

Notification of Reasons for Rejection corresponding to Japanese Patent Application No. 2020-027315, dated May 9, 2023 and its English translation.

*Primary Examiner* — Tarun Sinha
*Assistant Examiner* — James I Burris
(74) *Attorney, Agent, or Firm* — McCormick, Paulding & Huber PLLC

(57) ABSTRACT

A multicore cable inspection method of specifying a correspondence relationship among ends of insulated electric wires exposed from both ends of a multicore cable, the method including: inputting, by capacitance coupling, an inspection signal to the end of the insulated wire to be inspected among the ends of the insulated wires exposed at the one end of the multicore cable; inputting, by the capacitive coupling, each of first and second signals, each of which has a phase different from the inspection signal, to the ends of the two insulated wires other than the insulated wire to be inspected; measuring a voltage of an output signal outputted from the capacitive coupling from each end of the insulated wires exposed at the other end of the multicore cable; and specifying the other-side end of the insulated wire to be inspected. At this time, an amplitude of a signal obtained by (Continued)

adding the inspection signal and the first and second signals is smaller than that of the inspection signal.

18 Claims, 7 Drawing Sheets

(51) Int. Cl.
*H01B 13/22* (2006.01)
*H01R 43/28* (2006.01)
*G01R 19/165* (2006.01)

(58) Field of Classification Search
CPC ...... H01B 13/06; H01B 13/067; H01B 13/20; H01B 13/22; H01R 43/28
See application file for complete search history.

(56) References Cited

U.S. PATENT DOCUMENTS

| | | | |
|---|---|---|---|
| 2005/0199415 A1* | 9/2005 | Glew | H01B 7/185 |
| | | | 174/113 C |
| 2017/0115377 A1* | 4/2017 | Giannini | G01S 7/4017 |
| 2019/0212379 A1 | 7/2019 | Shirakawa et al. | |

FOREIGN PATENT DOCUMENTS

| | | | | |
|---|---|---|---|---|
| JP | S59-222010 A | | 12/1984 | |
| JP | H05226898 A | * | 9/1993 | ............ G01R 31/60 |
| JP | 2002040061 A | * | 2/2002 | ............ G01B 7/003 |
| JP | 2010-256102 A | | 11/2010 | |
| JP | 2019120608 A | | 7/2019 | |

* cited by examiner

| ITEM | COMPARATIVE EXAMPLE | EMBODIMENT |
|---|---|---|
| 3a [$\mu$V] | 8.71 | 7.36 |
| 3b [$\mu$V] | -2.45 | -1.74 |
| 3c [$\mu$V] | 3.67 | -2.13 |
| 3d [$\mu$V] | 3.7 | 1.75 |
| Vmax1 [$\mu$V] | 8.71 | 7.36 |
| Vmax2 [$\mu$V] | 3.7 | 1.75 |
| SN RATIO | 2.4 | 4.2 | ary
MULTICORE CABLE INSPECTION METHOD AND MULTICORE CABLE INSPECTION DEVICE

CROSS-REFERENCE TO RELATED APPLICATION

The present application claims priority from Japanese Patent Application No. 2020-27315 filed on Feb. 20, 2020, the content of which is hereby incorporated by reference into this application.

TECHNICAL FIELD OF THE INVENTION

The present invention relates to a multicore cable inspection method and a multicore cable inspection device, particularly to an inspection method and an inspection device that specify a correspondence relationship between both ends of a plurality of coaxial wires in a multicore cable.

BACKGROUND OF THE INVENTION

A multicore cable in which a large number of insulated wires each having a conductor coated with an insulator are collectively covered with a jacket has been known. For example, a cable having a large number of tens to hundreds of insulated wires (coaxial wire or the like) has been known as a multicore cable used for a medical probe cable.

In the multicore cable having such a large number of insulated wires, it is difficult to identify each of all the insulated wires by a color of the insulator. Further, when the insulated wires are twisted inside the multicore cable, a positional relationship among the insulated wires is not made constant. Therefore, in the multicore cable having a large number of insulated wires, in connecting it to a connector, a circuit board or the like, inspection needs to be performed in order to identify a correspondence relationship among ends of the insulated wires exposed from both ends of the multicore cable.

As an inspection method for identifying the correspondence relationship among the ends of the insulated wires in the multicore cable, for example, Patent Document 1 (Japanese patent application laid-open No. 2019-120608) discloses a method of arranging an electrode on an insulator and inputting an AC inspection signal to the conductor by capacitive coupling in a non-contact manner.

SUMMARY OF THE INVENTION

However, in the method of inputting the AC inspection signal to the conductor in a non-contact manner, if a large number of insulated wires are arranged at high density in the multicore cable, crosstalk among the insulated wires becomes large and the correspondence relationship among the ends of the insulated wires may not accurately identified. That is, there is a problem in which the accuracy of a multicore cable inspection method and a multicore cable inspection device is low.

Other problems and new features will become apparent from the description and the accompanying drawings herein.

A brief explanation of typical embodiments disclosed in the present application is as follows.

A multicore cable inspection method that is an embodiment is a method of specifying a correspondence relationship among ends of insulated wires exposed at both ends of a multicore cable, the method including: inputting, by capacitance coupling, an inspection signal to the end of the insulated wire to be inspected among the ends of the insulated wires exposed at the one end of the multicore cable; inputting, by the capacitive coupling, each of a plurality of signals different in one of an amplified and phase or either from the inspection signal to the ends of a plurality of insulated wires other than the insulated wire to be inspected; measuring a voltage of an output signal outputted from the capacitive coupling from each end of the insulated wires exposed at the other end of the multicore cable; and specifying the other-side end of the insulated wire to be inspected. Here, an amplitude of a signal obtained by adding the inspection signal and the other signals is smaller than that of the inspection signal.

A multicore cable inspection device that is an embodiment is a device which specifies a correspondence relationship among ends of insulated wires exposed at both ends of a multicore cable, the device includes: an inspection signal input means of inputting, by capacitive coupling, an inspection signal to an end of a first insulated wire to be inspected among the ends of the insulated wires exposed at one end of the multicore cable; an antiphase inspection signal input means of inputting, by the capacitive coupling, each of a plurality of insulated wires other than the first insulated wire, each of which has a phase different in an amplitude and phase or either from that of the inspection signal, to the ends of the plurality of insulated wires other than the insulated wire to be inspected among the ends of the insulated wires exposed at the one end of the multicore cable; and an arithmetic unit of measuring a voltage of an output signal outputted by the capacitive coupling from each end of the insulated wires exposed at the other end of the multicore cable, and specifying an other-side end of the first insulated wire based on the measured voltage. Here, an amplitude of a signal obtained by adding the inspection signal and each of the other signals is smaller than an amplitude of the inspection signal.

According to the present invention, the reliability of the multicore cable inspection device can be improved.

DESCRIPTIONS OF THE PREFERRED EMBODIMENTS

Figure 1:
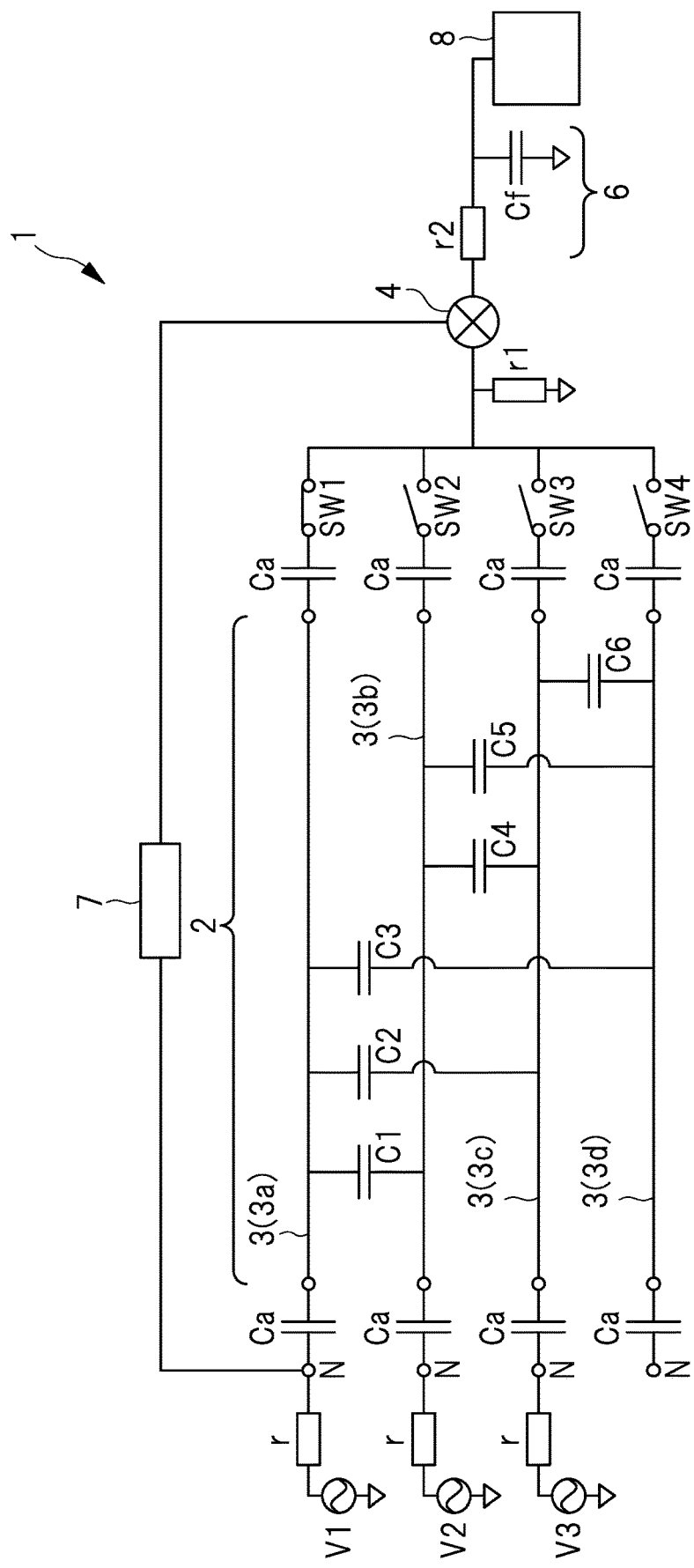
FIG. 1 is an equivalent circuit diagram showing a configuration of a multicore cable inspection device according to a first embodiment.

Hereinafter, embodiments of the present invention will be described in detail with reference to the drawings. Incidentally, through all the drawings for explaining the embodiments, members having the same function are denoted by the same reference numerals, and repetitive description thereof will be omitted. Further, in the embodiments, the explanation of the same or similar parts is not repeated in principle unless it is particularly necessary. Incidentally, the "amplitude" referred to in the present application means an amplitude of voltage. Further, in the present application, each of a first auxiliary signal, a second auxiliary signal, and the like may be referred to as an auxiliary signal.

First Embodiment

Structure of Multicore Cable Inspection Device of Present Embodiment

Figure 2:
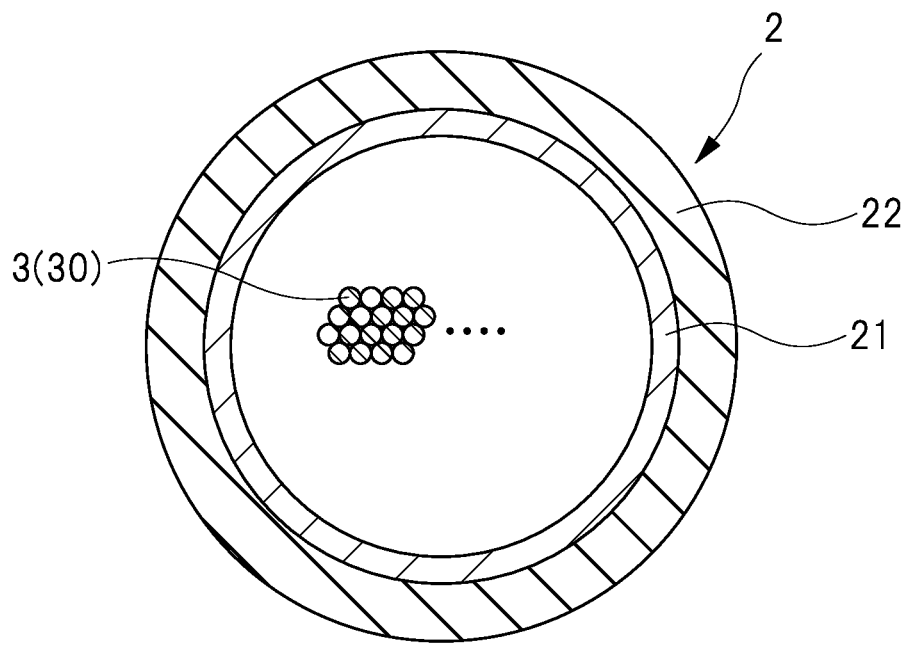
FIG. 2 is a sectional view schematically showing a multicore cable.
Figure 3:
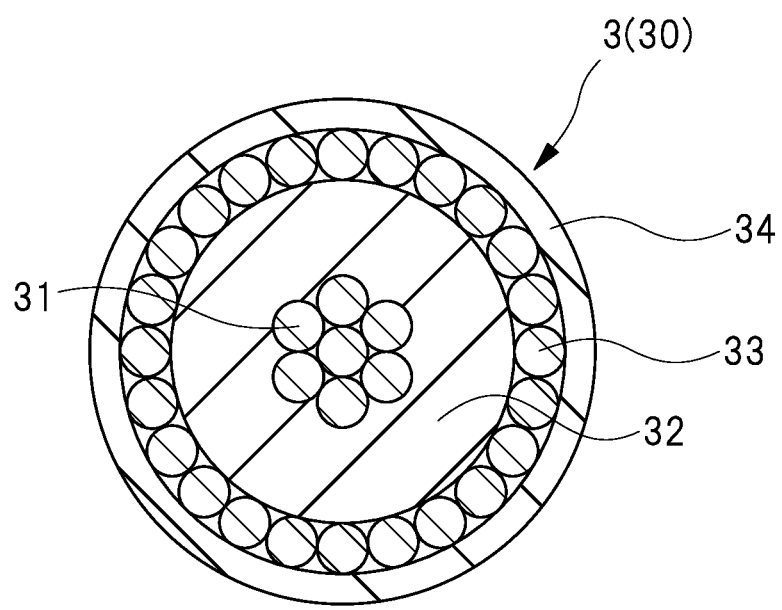
FIG. 3 is a sectional view of an insulated wire constituting the multicore cable.
Figure 4:
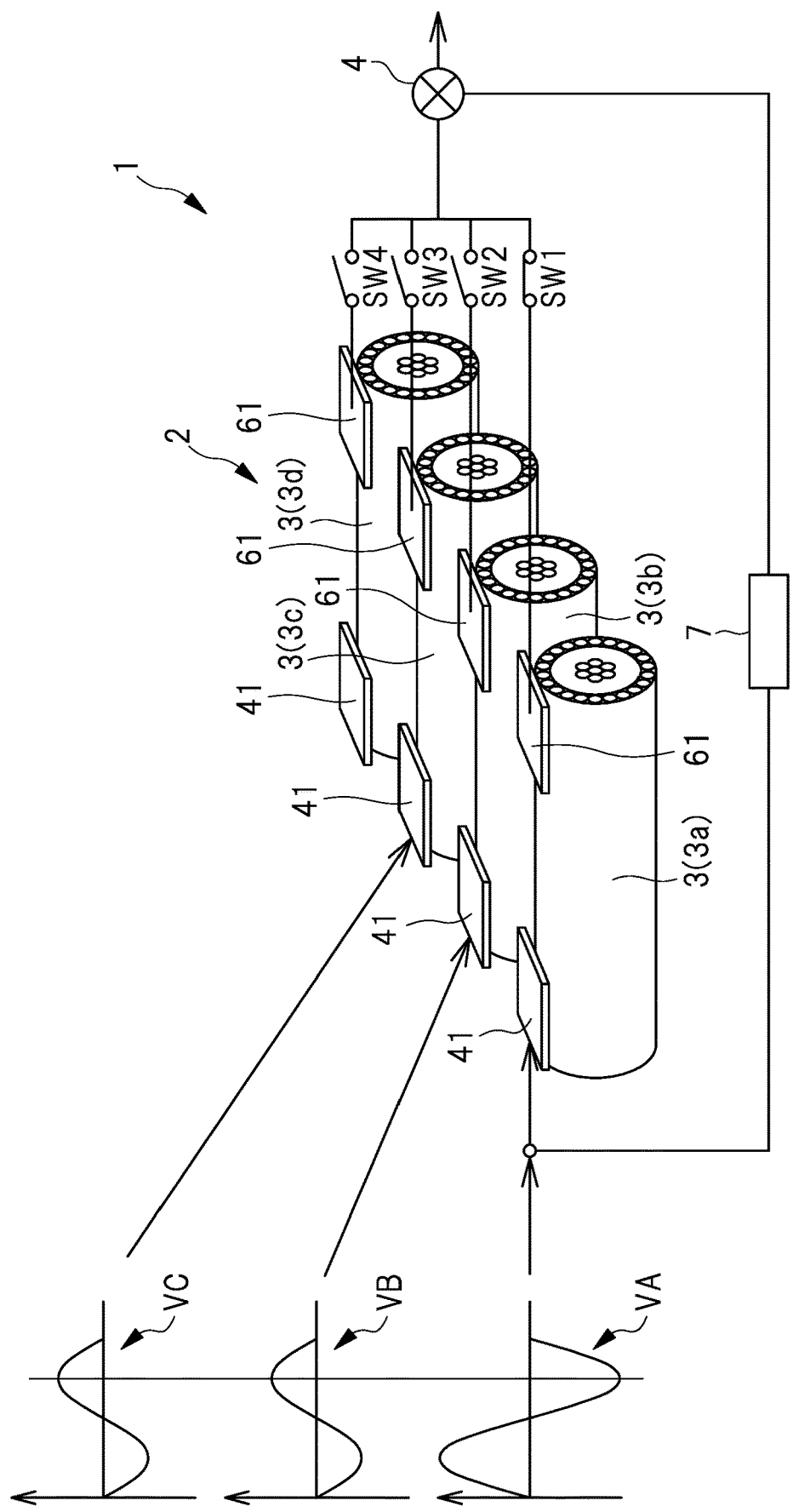
FIG. 4 is a schematic view showing a configuration of the multicore cable inspection device according to the first embodiment.

FIG. 1 is an equivalent circuit diagram showing a configuration of a multicore cable inspection device used in a multicore cable inspection method according to the present embodiment. FIG. 2 is a sectional view schematically showing a section (a section along a lateral direction) of a multicore cable perpendicular to a longitudinal direction thereof. FIG. 3 is a sectional view showing a section (a section along a lateral direction) perpendicular to a longitudinal direction of one insulated wire among a plurality of insulated wires constituting the multicore cable. FIG. 4 is a schematic view showing a configuration of the multicore cable inspection device used in the multicore cable inspection method according to the present embodiment.

A multicore cable inspection device 1 shown in FIGS. 1 and 4 is used for an inspection for identifying a correspondence relationship between respective ends of insulated wires 3 exposed from both ends of one multicore cable 2 shown in FIG. 2. The multicore cable 2 is a cable obtained by bundling n (for example, about 10 to 300) insulated wires 3 into a group. Here, the "n" is an integer of 3 or more. In the multicore cable 2 having such a large number of insulated wires 3, it is difficult to identify each of all the insulated wires 3 by color of an insulator constituting (covering) a surface of the insulated wires 3. Further, when the insulated wires 3 are twisted inside the multicore cable 2, a positional relationship among the insulated wires 3 is not constant. Consequently, in the multicore cable 2 having a large number of insulated wires 3, an inspection(s) needs to be performed in order to specify the correspondence relationship among the respective ends of the insulated wires 3 exposed from the both ends of the multicore cable 2 in connecting with a connector, a circuit board or the like.

After specifying the correspondence relationship among the ends of the insulated wires 3 in the multicore cable 2, the respective insulated wires 3 at the both ends of the multicore cable 2 are connected to not-shown connectors or circuit boards (for example, an internal board etc. of a sensor unit in a sonic probe), so that a multicore cable assembly is obtained.

As shown in FIG. 2, the multicore cable 2 has a large number of coaxial wires 30 bundled into one group, and includes a package shield 21 and a jacket 22 that are sequentially provided so as to surround an outer periphery of the large number of coaxial wires 30 and each of which is made of a braid. The number of insulated wires 3 in the multicore cable 2 is not particularly limited, but the present embodiment can be applied to the multicore cable 2 having three or more insulated wires 3. Further, the present embodiment is preferably applied to the multicore cable 2 having a total of four or more insulated wires 3 containing: an insulated wire 3 for inputting an inspection signal; two or more insulated wires 3 for inputting an auxiliary signal; and an insulated wire 3 in which no signal is inputted and noise generated by crosstalk should be reduced.

As each of the plurality of insulated wires 3 shown in FIG. 2, the coaxial wire 30 shown in FIG. 3 can be used. The coaxial wire 30 has: a central conductor 31; and an insulator 32, an outer conductor (shield) 33, and an outer skin (jacket) 34, which are sequentially provided on an outer periphery of the central conductor 31. The insulator 32 is made of, for example, a foam layer. In one coaxial wire 30, for example, seven metal wires form one stranded conductor. However, the central conductor 31 in the insulated wire 3 may be a single wire. Further, the insulated wire 3 may be composed of only the central conductor 31 and insulator 32. An outer diameter of the coaxial wire 30 is, for example, 0.2 mm to 0.5 mm. A diameter of the center conductor 31 is, for example, 50 µm.

As shown in FIG. 1, the multicore cable inspection device 1 includes: voltage sources V1, V2 and V3 which are inspection signal input means; and a phase device 7 which is a reference signal generation circuit.

The inspection signal input means is a means to input (apply) an AC inspection signal VA, first auxiliary signal (first signal) VB, or second auxiliary signal (second signal) VC (see FIG. 4) which is connected, by capacitive coupling, to the end of the insulated wire 3 to be inspected among the ends of the insulated wires 3 exposed at one end of the multicore cable 2. In the present embodiment, the inspection signal input means has: a voltage source V1 that generates an inspection signal; a voltage source V2 that generates a first auxiliary signal; and a voltage source V3 that generates a second auxiliary signal. Further, the inspection signal input means includes: a plurality of switches (not shown) for switching about which insulation wire 3 each of the inspection signal, first auxiliary signal, or second auxiliary signal is inputted to; and an electrode substrate (not shown) having a plurality of electrodes 41 (see FIG. 4) electrically connected to respective outputs of their plural switches. The electrode substrate is used to input, by capacitive coupling, the inspection signal, first auxiliary signal, or second auxiliary signal to the insulated wire 3 by bringing the electrode 41 into contact with the outer peripheral surface of the insulated wire 3.

As shown in FIG. 1, the voltage source V1 is electrically connected to the insulated wire 3 via a resistor r, a node N, and a coupling capacitance Ca in this order. The node N corresponds to the electrode 41 shown in FIG. 4. Similarly, each of the voltage sources V2 and V3 is electrically connected to the insulated wire 3 via the resistor r, the node N, and the coupling capacitance Ca in this order. Incidentally, the resistor r is not connected to the insulated wire 3 to which none of the voltage sources V1 to V3 is connected.

When only the inspection signal is inputted to one insulated wire 3 to be inspected without inputting the first auxiliary signal and the second auxiliary signal, crosstalk causes a signal (noise) similar to the inspection signal to be induced and flow in the other insulated wires 3 around the one insulated wire 3. As a result, it becomes difficult to specify the correspondence relationship between the ends of the insulated wires 3 to be inspected. Therefore, in the present embodiment, the first auxiliary signal is inputted to the first insulated wire 3 different from the insulated wire 3 to be inspected, and the second auxiliary signal is inputted to the second insulated wire 3 different from the insulated wire 3 to be inspected and the first insulated wire 3. This makes it possible to prevent an amplitude (voltage) of a signal generated by the crosstalk from becoming as large as the inspection signal and to improve reliability of the inspection for specifying the correspondence relationship among the ends of the insulated wires 3.

Here, since the inspection signal, first auxiliary signal, or second auxiliary signal is inputted to the insulated wire 3 by the capacitive coupling, an AC signal is used as those signals. Each frequency of the inspection signal, first auxiliary signal, and second auxiliary signal needs to be smaller than a resonance frequency of the multicore cable 2, and can be appropriately set according to a structure etc. of the multicore cable 2. More specifically, the frequency is, for example, 1 kHz or more and 10 MHz or less. In the present embodiment, for example, 2.5 MHz inspection signal, first auxiliary signal, and second auxiliary signal are used. Here, the respective frequencies of the inspection signal, first auxiliary signal, and second auxiliary signal are the same as each other.

Although only four insulated wires 3 are shown in FIGS. 1 and 4, there are really, for example, 10 to 300 insulated wires 3. However, the number of insulated wires 3 in which any of the inspection signal, first auxiliary signal, and second auxiliary signal is inputted is only three, and no signal is inputted to each of the other plurality of insulated wires 3. Further, although the plurality of insulated wires 3 shown in FIGS. 1 and 4 are separated from each other, they are really put together by the jacket 22 or the like as shown in FIG. 2. That is, in FIGS. 1 and 4, the illustration of the jacket 22 or the like covering portions other than both ends of each of the plurality of insulated wires 3 is omitted.

As shown in FIG. 4, the plurality of insulated wires 3 (here, coaxial wire 30) exposed at one end (input side) of the multicore cable are fixed in an aligned state on an inspection table (not shown). The electrode 41 is abutted against a surface (side surface in a lateral direction) of each end of the plurality of insulated wires 3 arranged in this way. For example, by the inspection table and an electrode substrate (dielectric substrate) in which a plurality of electrodes 41 are formed side by side and a wiring pattern is formed, the plurality of insulated wires 3 are sandwiched, and the electrodes 41 are brought into contact with the insulated wires 3. On the electrode substrate, the same number of electrodes 41 as the plurality of insulated wires 3 are arranged (aligned) and formed at the same intervals as the insulated wires 3. Further, outputs of the plurality of switches are electrically connected to the electrode 41, and the inspection signal, first auxiliary signal, or second auxiliary signal is inputted to the electrode 41 selected by the switch.

That is, when the inspection signal is inputted to the arbitrary electrode 41, the inspection signal is inputted to the insulated wire 3 corresponding to the arbitrary electrode 41 by the capacitive coupling. In the present embodiment, since the coaxial wire 30 is used as the insulated wire 3, the inspection signal is inputted to an outer conductor 33 of the insulated wire 3. Additionally, the first auxiliary signal is inputted to another insulated wire 3 by the capacitive coupling. Furthermore, the second auxiliary signal is inputted to yet another insulated wire 3 by the capacitive coupling. In this way, the inspection signal, first auxiliary signal, or second auxiliary signal is inputted to the insulated wires 3 that are different from one another. Further, the inspection is not performed in a state where any of the inspection signal, first auxiliary signal, and second auxiliary signal is not inputted, and all of the three signals are inputted at the time of the inspection.

Each of the first auxiliary signal VB (see FIG. 4) and the second auxiliary signal VC (see FIG. 4) is a signal having, by an antiphase inspection signal means (not shown), an antiphase in which a phase of the inspection signal VA (see FIG. 4) is changed by 180 degrees ($\pi$), magnitude of an amplitude (voltage) of the signal being a half ($\frac{1}{2}$) of that of the inspection signal VA. In other words, a difference between each phase of the first auxiliary signal VB and second auxiliary signal VC and a phase of the inspection signal VA is $\pi$.

The first auxiliary signal VB and the second auxiliary signal VC may be generated by adjusting the phase and amplitude (voltage) of the inspection signal VA, but the present invention is not limited to this, and may separately have a voltage source for generating each of the first auxiliary signal VB and the second auxiliary signal VC. It is most desirable that each amplitude of the first auxiliary signal VB and the second auxiliary signal VC is a half ($\frac{1}{2}$) of the amplitude of the inspection signal VA. In other words, a result of adding the respective voltages of the inspection signal VA, the first auxiliary signal VB having the antiphase of the inspection signal VA, and the second auxiliary signal VC having the antiphase of the inspection signal VA is zero.

Similar to the inspection table provided at one end (input side) of the multicore cable 2, an inspection table (not shown) provided at the other end (output side) of the multicore cable 2 is provided, and a plurality of electrodes 61 (see FIG. 4) provided on an electrode substrate (not shown) are pressed against each insulated wire 3. Consequently, the capacitive coupling causes an output signal from the insulated wire 3 (the signal transmitted through the outer conductor 33 shown in FIG. 3) to be outputted to the electrode 61. Since the inspection table and the electrode substrate on the output side have the same configuration as the inspection table and the electrode substrate on the input side, description thereof will be omitted here.

A switch for switching about which of the insulated wires 3 the output signal is outputted from is electrically connected to each of the electrodes 61 capacitively coupled to the output-side ends of the plurality of insulated wires 3. In FIGS. 1 and 4, switches SW1 to SW4 electrically connected to the electrodes 61 are shown at the output-side ends of the four insulated wires 3 as the above-mentioned switches. However, a switch(es) electrically connected to an input-side end(s) of a not-shown insulated wire(s) 3 is also provided really. A multiplier (mixer) 4 that multiplies a reference signal having the same frequency and the same phase as those of the output signal of the inspection signal VA to obtain a detection signal is electrically connected to each output-side terminal of the switches SW1 to SW4. Further, one end of the resistor r1 is electrically connected between each output-side terminal of the switches SW1 to SW4 and the multiplier 4, and the other end of the resistor r1 is electrically connected to the ground.

A low-pass filter 6 for removing high-frequency components in the detection signal outputted from the multiplier 4 is electrically connected to the multiplier 4. An input-side terminal of a phaser 7 is electrically connected to the electrode 41 to which the inspection signal VA is inputted, and an output-side terminal of the phaser 7 is electrically connected to the multiplier 4. When signals each having the same phase and the same frequency are multiplied by the multiplier 4, a DC component and a component having a frequency twice larger than the original frequency are generated. The low-pass filter 6 removes the component having the frequency of two times, and outputs only a DC component as a detection signal. The low-pass filter 6 is composed of a resistor r2 and a capacitance Cf electrically connected between the resistor r2 and the ground.

The phaser 7 has a role of: adjusting the phase of the inspection signal branched from the voltage source V1; regarding it as a reference signal; amplifying it; and outputting it to the multiplier 4. A phase amount of phaser 7 is appropriately adjusted so that the inspection signal and the reference signal in the multiplier 4 have the same phase by considering a phase shift in transmitting the capacitive coupling and the multicore cable 2.

The signal outputted from the low-pass filter 6 is measured by an arithmetic unit 8 (not shown). The arithmetic unit 8 is electrically connected to the resistor r2 and the capacitance Cf. The arithmetic unit 8 measures each voltage of the output signals outputted from the ends of the insulated wires 3 exposed at the other end of the multicore cable 2, and specifies the other end of the insulated wire 3 to be inspected based on the voltage of the measured output signal.

The arithmetic unit 8 controls the above-mentioned plurality of switches on the input side and the plurality of switches SW1 to SW4 on the output side to determine the correspondence relationship among the respective ends of the insulated wires 3. That is, the arithmetic unit 8 controls the switches, thereby causing: the inspection signal VA to be inputted to the end of the predetermined insulated wire 3 to be inspected at one end of the multicore cable 2; the first auxiliary signal VB to be inputted to the end of the arbitrary insulated wire 3; and the second auxiliary signal VC to be inputted to the end of the other arbitrary insulated wire 3. Then, the arithmetic unit 8 controls the switches SW1 to SW4 on the output side, and sequentially measures the voltage of the output signal corresponding to all the insulated wires 3 at the other end of the multicore cable 2.

The arithmetic unit 8 specifies (identifies), as the other-side end of the insulated wire 3 to be inspected, the end of the insulated wire having the highest outputted signal voltage among the ends of the respective insulated wires 3 exposed at the other end of the multicore cable 2, and memorizes the above-mentioned correspondence relationship. The correspondence relationship among the ends of the insulated wires 3 is represented by, for example, associating: numbers sequentially given to the ends of the insulated wires 3 aligned and arranged at one end of the multicore cable 2; and numbers sequentially given to the ends of the insulated wires 3 aligned and arranged at the other end of the multicore cable 2. The arithmetic unit 8 sequentially changes the insulated wires 3 to be inspected, specifies and stores the correspondence relationship among the ends of all the insulated wires 3.

As described above, in the present embodiment, the end of the insulated wire having the highest outputted signal voltage is specified as the other-side end of the insulated wire 3 to be inspected. After specifying the correspondence relationships among all the ends, the correspondence relationship among the insulation wires 3 at output terminals corresponding to the insulation wires 3 at respective input terminals is obtained. At this time, the insulated wires 3 at output terminals corresponding to the insulated wires 3 at different input terminals may be equal to one another. This is called duplication. At this time, it is determined that there is an error in the specifications of the correspondence relationships. Such duplication is caused by the mutual positional relationship among the insulated wire 3 for inputting the inspection signal, first auxiliary signal VB, and second auxiliary signal VC, the outer conductor 33 (see FIG. 3), and the insulated wire 3 for acquiring the inspection signal. Consequently, in the certain insulated wire 3, the crosstalk of the inspection signal VA, first auxiliary signal VB, and second auxiliary signal VC becomes unbalanced, which may cause a false detection.

That is, values of the capacities C1 to C6 (see FIG. 1) between the insulated wires 3 are different from each other depending on the positional relationship of each of the plurality of insulated wires 3, and the crosstalk of each signal becomes unbalanced in the certain insulated wire 3 depending on a combination of the insulated wires 3 that input each of the inspection signal VA, first auxiliary signal VB, and second auxiliary signal VC. As a result, a signal similar to the inspection signal VA is induced in the insulated wire 3 different from the insulated wire 3 to which the inspection signal VA is inputted, which causes the duplication.

The arithmetic unit 8 determines whether the duplication (overlap) exists among the insulated wires 3 on the other side corresponding to the ends of the plurality of insulated wires 3 exposed at one end of the multicore cable 2. When the arithmetic unit 8 determines that there is the duplication, the arithmetic unit 8 changes to another insulated wire 3 the insulated wire 3 for inputting the first auxiliary signal VB, second auxiliary signal VC, or both. Thereafter, only for the overlapped insulated wires 3 at the input terminals, the correspondence relationship among the ends of the insulated wires is specified again. That is, when such a re-determination is performed, the auxiliary signal is not inputted to the insulated wire 3 which inputs the auxiliary signal in determining that there is the duplication, and the auxiliary signal is inputted to the insulated wire 3 different from the relevant insulated wire 3. As a result, such a state occurs that the crosstalk of each signal in the insulated wire 3 that specifies the correspondence relationship among the ends is not unbalanced, which leads to making the identification possible.

Multicore Cable Inspection Method

Here, a multicore cable inspection method of the present embodiment will be described with reference to FIGS. 1, 2 and 4. Here, the insulated wire 3 for inputting the inspection signal VA is called an insulated wire (first insulated wire) 3a, the insulated wire 3 for inputting the first auxiliary signal VB is called an insulated wire (second insulated wire) 3b; the insulated wire 3 for inputting the second auxiliary signal VC is called an insulated wire (third insulated wire) 3c; the insulated wire 3 is inputted to none of the inspection signal VA, first auxiliary signal VB, and second auxiliary signal VC is called an insulated wire (fourth insulated wire) 3d.

Further, coupling capacitance of a capacitive coupling portion between the respective electrodes 41 and 61 at the end of each insulated wire 3 is denoted by Ca. Furthermore, coupling capacitance between the insulated wire 3a and the insulated wire 3b is denoted by C1; coupling capacitance between the insulated wire 3a and the insulated wire 3c is denoted by C2; and coupling capacitance between the insulated wire 3a and the insulated wire 3d is denoted by C3. Further, coupling capacity between the insulated wire 3b and the insulated wire 3c is denoted by C4; coupling capacitance between the insulated wire 3b and the insulated wire 3d is denoted by C5; and coupling capacitance between the insulated wire 3c and the insulated wire 3d is denoted by C6. Further, the voltages of the output signals of the insulated wires 3a, 3b, 3c and 3d are denoted by v1, v2, v3 and v4, respectively.

In the multicore cable inspection method according to the present embodiment, first, the jacket 22 and the package shield 21 (see FIG. 2) each having a predetermined length are removed from both ends of the multicore cable 2 to expose the both ends of each insulated wire 3. Thereafter, the exposed insulated wires 3 are fixed to the inspection table at each of the both ends of the multicore cable 2, and the electrodes 41 and 61 are pressed against the both ends of each insulated wire 3, respectively. Then, an inspection is performed to identify the correspondence relationship among the ends of the insulated wires 3.

In the inspection, the inspection signal VA is inputted to the arbitrary insulated wire 3 (here, insulated wire 3a). At the same time, the first auxiliary signal VB is inputted to the arbitrary insulated wire 3 (here, insulated wire 3b) different from the insulated wire 3a. Further, at the same time, the second auxiliary signal VC is inputted to the arbitrary insulated wire 3 (here, the insulated wire 3c) different from the insulated wires 3a and 3b.

The respective frequencies of the inspection signal VA, first auxiliary signal VB, and second auxiliary signal VC are the same as one another. Further, each of the first auxiliary signal VB and the second auxiliary signal VC is a signal having a phase opposite to that of the inspection signal VA and having a half (½) of magnitude of an amplitude (voltage) of the inspection signal. At a predetermined point of time, a sum of the voltages of the inspection signal VA, first auxiliary signal VB having the antiphase of the inspection signal VA, and second auxiliary signal VC having the antiphase of the inspection signal VA is zero.

As described above, the multicore cable inspection method of the present embodiment includes the steps of: inputting the inspection signal VA by the capacitive coupling to the end of the first insulated wire to be inspected among the ends of the plurality of insulated wires exposed at one end of the multicore cable; inputting the first auxiliary signal VB having a phase different from that of the inspection signal VA, by the capacitive coupling, to the end of the second insulated wire other than the first insulated wire among the ends of the plurality of insulated wires exposed at one end of the multicore cable; and inputting the second auxiliary signal VC having a phase different from that of the inspection signal VA, by the capacitive coupling, to the end of the third insulated wire other than the first insulated wire and second insulated wire among the ends of the plurality of insulated wires exposed at one end of the multicore cable.

Next, the switches SW1 to SW4 electrically connected to the output sides of the plurality of insulated wires 3 are controlled, and the switches SW1 to SW4 are turned on one by one in order. That is, for example, the switch SW1 is turned on, and the other switches SW2 to SW4 are turned off. Subsequently, the switches SW1, SW3 and SW4 are turned off, and the switch SW2 is turned on. In this way, each of the output signals of the plurality of insulated wires 3 is received one by one. The received output signal is multiplied as a reference signal by the multiplier 4. Here, the reference signal has the same phase as the phase of the inspection signal VA at the time when the inspection signal VA reaches the multiplier. Further, the output signal of the multiplier 4 uses the low-pass filter 6 to select only the DC (direct current) component, and obtains the calculated (computed) output signal. The values of these calculated output signals are stored in the arithmetic unit 8.

Next, the arithmetic unit 8 identifies, as the other-side end of the insulated wire 3 to be inspected, the end that outputs the largest signal (here, a signal obtained by multiplying the output signal by the reference signal) among the ends of the respective insulated wires 3, and stores the relevant correspondence relationship.

Next, the inspection signal VA is inputted to the insulated wire 3 different from the insulated wire 3a. At this time, the phaser 7 is also electrically connected to the electrode 41 (node N) abutted at the end of the insulated wire 3 different from the insulated wire 3a. Further, the first auxiliary signal VB and the second auxiliary signal VC are inputted to the two insulated wires 3 different from the insulated wire 3, respectively. Subsequently, the switches SW1 to SW4 are controlled, and each of the calculated output signals of the plurality of insulated wires 3 is measured one by one to identify the other-side end of the insulated wire 3 to be inspected.

In this way, the inspection signal VA is sequentially inputted to each of the plurality of insulated wires 3, and the output signals of the plurality of insulated wires 3 are measured each time the input is performed, so that the correspondence relationship between all the both ends of each of the insulated wires 3 is specified and stored in the arithmetic unit 8. This leads to completion of the inspection for identifying the correspondence relationship among the ends of the insulated wires 3 exposed from the both ends of the multicore cable 2 is completed. The arithmetic unit 8 outputs a stored specific result of the correspondence relationship to, for example, a monitor. Then, its process ends.

As described above, the multicore cable inspection method of the present embodiment includes the steps of: measuring the voltage of the output signal outputted by the capacitive coupling from each end of the insulated wires exposed at the other end of the multicore cable; and identifying the other-side end of the first insulated wire based on the measured voltage.

However, duplication (overlap) may occur during the above inspection process. After specifying the correspondence relationships among all the ends, the correspondence relationship among the insulation wires 3 at output terminals corresponding to the insulation wires 3 at respective input terminals are obtained. At this time, the insulated wires 3 at the output terminals corresponding to the insulated wires 3 at the different input terminals may be equal to one another. This is called duplication (overlap). At this time, it is determined that there is an error in the identification of the correspondence relationship. The arithmetic unit 8 determines whether there is an overlap(s) among the insulated wires 3 on the other sides corresponding to the ends of the plurality of insulated wires 3 exposed at the one end of the multicore cable 2. When the arithmetic unit 8 determines that there is the overlap, the arithmetic unit 8 changes to another insulated wire 3 the insulated wire 3 for inputting the first auxiliary signal VB, the second auxiliary signal VC, or both. Then, only for the overlapped insulated wires 3 at the input terminals, the correspondence relationship among the ends of the overlapped insulated wires is specified again. As a result, a state in which the crosstalk of each signal in the insulated wire 3 that again specifies the correspondence relationship among the ends is not unbalanced occurs stochastically, and the state can be specified.

In the present embodiment, a case where the auxiliary signal is inputted only to the two insulated wires 3 has been described, but the number of insulated wires 3 for inputting the auxiliary signals may be two or more. That is, the inspection signal is inputted to one insulated wire 3, and m auxiliary signals are inputted to m insulated wires 3. At this time, m is a natural number of 2 or more and n−1 or less. In other words, a value of m, which is a natural number, is represented by n−1≥m≥2. Further, a voltage amplitude of the auxiliary signal inputted to each insulated wire 3 is preferably 1/m of a voltage amplitude of the inspection signal. For example, when m=3, the first to third auxiliary signals each having a voltage amplitude of ⅓ of the voltage amplitude of the inspection signal are inputted to the three insulated wires 3, respectively.

Further, the inspection signal and each auxiliary signal have the same frequency, and a phase of each auxiliary signal is antiphase to the phase of the inspection signal (phase in which the phase changes by π with respect to the inspection signal). Consequently, an amplitude (voltage) of a signal obtained by adding the inspection signal and any of the auxiliary signals of the first to m-th auxiliary signals is smaller than the amplitude (voltage) of the inspection signal. Further, an amplitude (voltage) of a signal obtained by adding the inspection signal and all the auxiliary signals of the first to m-th auxiliary signals is smaller than the amplitude (voltage) of the inspection signal.

Effects of Present Embodiment

As an inspection method of identifying the correspondence relationship among the ends of the insulated wires exposed from the both ends of one multicore cable, it is conceivable to carry out an inspection in which an inspection signal is inputted to one insulated wire and no signal is inputted to the other insulated wires. However, in this inspection method, the crosstalk between the insulated wires is large, and a signal (noise) having the same voltage (amplitude) as that of the inspection signal is induced in the insulated wire different from the insulated wire to which the inspection signal is inputted. As a result, a value of an SN ratio, which is a ratio of the inspection signal to the induced signal (noise), becomes small, and this causes a problem of making it difficult to specify the correspondence relationship among the ends of the insulated wires to be inspected. Therefore, there is a risk of erroneous detection in the inspection of the correspondence relationship among the ends of the insulated wires.

Figure 8:
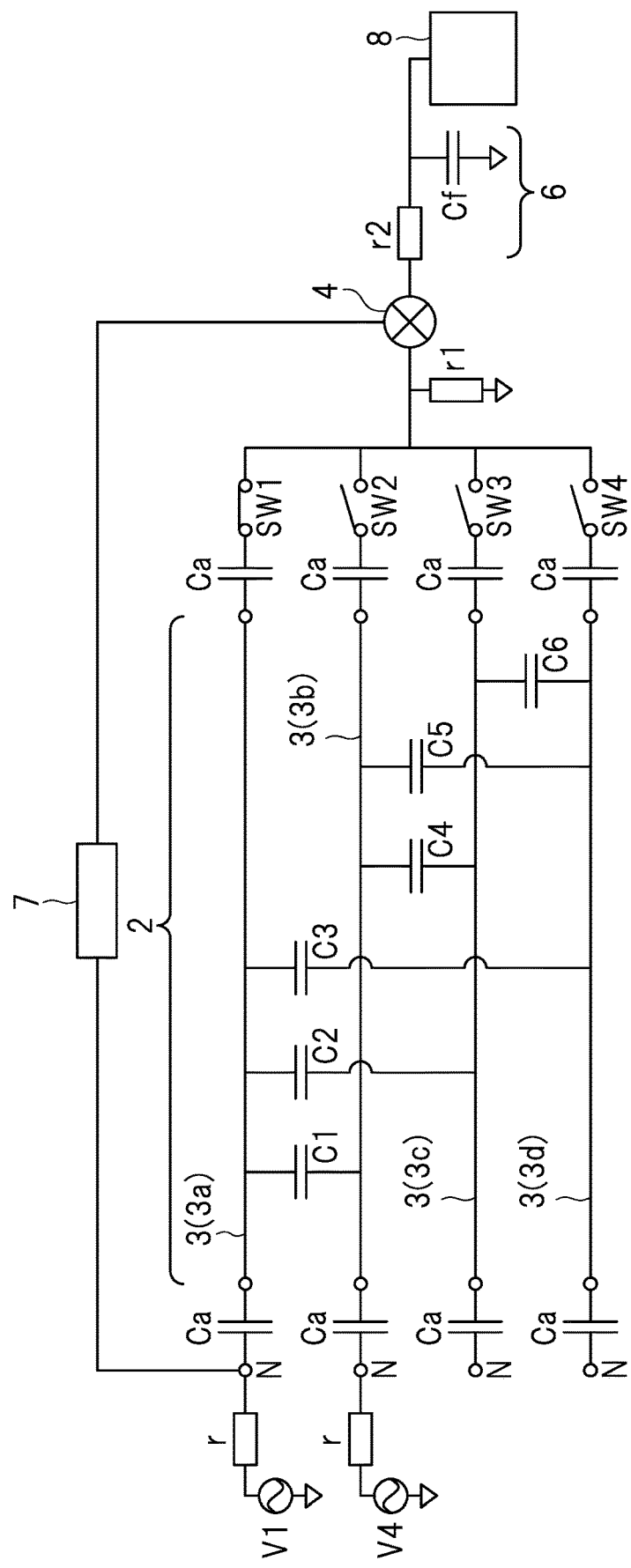
FIG. 8 is an equivalent circuit diagram showing a configuration of the multicore cable inspection device according to the comparative example.
Figure 9:
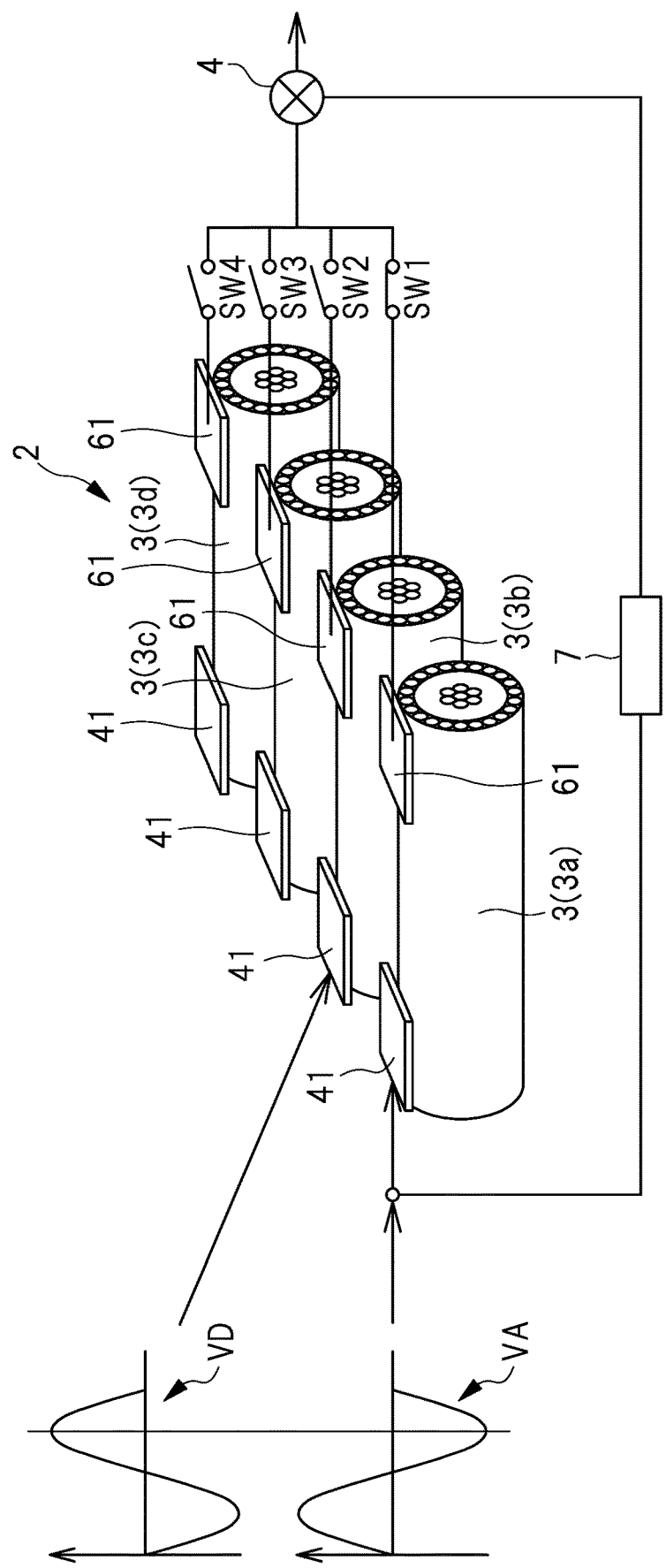
FIG. 9 is a schematic view showing a configuration of the multicore cable inspection device according to the comparative example.

In contrast, as a comparative example, as shown in FIGS. 8 and 9, it is conceivable to suppress the occurrences of the crosstalk by inputting the inspection signal to the insulated wire 3a among the plurality of insulated wires 3 and inputting an antiphase inspection signal (auxiliary signal) to the other one insulated wire 3b. The antiphase inspection signal of the comparative example is a signal whose phase is an antiphase obtained by changing the phase of the inspection signal by 180 degrees (π) and in which the magnitude of the amplitude (voltage) is the same as that of the inspection signal. FIG. 8 is an equivalent circuit diagram showing a configuration of a multicore cable inspection device used in the multicore cable inspection method according to the comparative example. FIG. 9 is a schematic view showing the configuration of a multicore cable inspection device used in the multicore cable inspection method according to the comparative example.

The configuration of the inspection device shown in FIGS. 8 and 9 is almost the same as the configuration of the inspection device of the present embodiment shown in FIGS. 1 and 4 except that the number of insulated wires 3 for inputting the auxiliary signals is small and the voltage (amplitude) of the auxiliary signal is large.

Here, basically, the plurality of coupling capacitances Ca shown in FIG. 1 all have substantially the same value (for example, 2 pF). However, some coupling capacities Ca may have different values (e.g., 1.995 pF) than those of the other coupling capacities Ca. That is, variations may occur in the plurality of coupling capacities Ca. It is conceivable as a reason for this that, for example, a distance between the electrode 41 for inputting the antiphase inspection signal (auxiliary signal) and the external conductor (shield) 33 (see FIG. 3) in the insulated wire 3 may be larger than a distance between each of the other electrodes 41, 61 and the outer conductor 33 in the insulated wire 3. That is, the distance between each of the electrodes 41, 61 and the outer conductor 33 may change depending on a position of the outer conductor 33, a distance between the insulated wire 3 and each of the electrodes 41, 61, or the like. As the distance between the electrode 41 for inputting the antiphase inspection signal (auxiliary signal) and the outer conductor 33 becomes large, the coupling capacitance Ca becomes small and the input impedance thereof increases, so that an input level of the auxiliary signal decreases. As a result, in the comparative example, the effect of reducing the crosstalk is reduced, and this leads to causing a problem of deteriorating (decreasing) the SN ratio. Therefore, it is required to more accurately identify the correspondence relationship among the ends of the insulated wires 3 than that in the comparative example.

In contrast, in the multicore cable inspection method according to the present embodiment, the inspection signal VA is inputted, by the capacitive coupling, to the end of the first insulated wire to be inspected among the ends of the insulated wires exposed at the one end of the multicore cable. At the same time, a first signal (first auxiliary signal VB) having a phase different from that of the inspection signal is inputted, by the capacitive coupling, to the end of the second insulated wire other than the first insulated wire among the ends of the plurality of insulated wires exposed at the one end of the multicore cable, and a second signal (second auxiliary signal VC) having a phase different from that of the inspection signal VA is inputted, by the capacitive coupling, to the end of the third insulated wire other than the first insulated wire and the second insulated wire among the ends of the plurality of insulated wires exposed at the one end of the multicore cable. Then, the arithmetic unit 8 measures a DC of a signal voltage obtained by multiplying, by a reference signal, an output signal outputted via the capacitive coupling from each end of the insulated wires 3 exposed at the other end of the multicore cable 2, and specifies the other-side end of the insulated wire 3 to be inspected based on the measured voltage (here, a detection signal obtained by multiplying the output signal by the reference signal).

More specifically, the auxiliary signal having a phase opposite to that of the inspection signal and having 1/m of the amplitude of the inspection signal is inputted, by the capacitive coupling, to each of the ends of m (n−1≥m≥2) insulated wires 3 other than the insulated wires 3 to be inspected among the ends of the insulated wires 3 exposed at the one end of the multicore cable 2.

By inputting the inspection signal and two or more auxiliary signals, those signals are mutually cancelled due to the crosstalk in the other insulated wires 3 that have not inputted those signals. As a result, it is possible to suppress an influence of the crosstalk and to specify the correspondence relationship among the ends of the insulated wires 3 with good accuracy. In particular, the present invention can be appropriately used for the multicore cable 2 in which a large number of insulated wires 3 are densely arranged and the coupling capacity between the insulated wires 3 is large. Further, in the multicore cable 2 having the package shield 21 (see FIG. 2), its coupling capacitance is larger than that of a cable having no package (collective) shield 21, so that the effect of using the present invention is large.

Figures 5, 6:
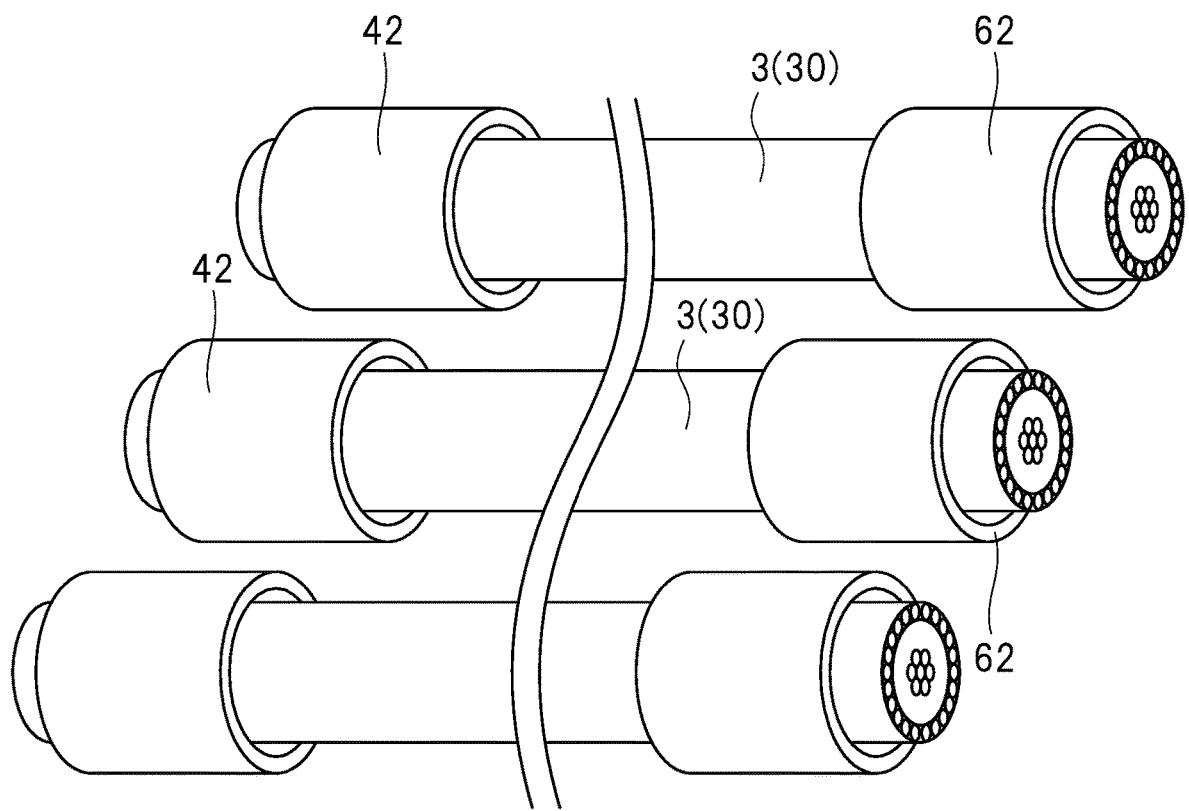
FIG. 5 is a table showing inspection results of a correspondence relationship between ends of the insulated wires, the inspection being performed by using the respective multicore cable inspection devices of a comparative example and the first embodiment.
FIG. 6 is a perspective view showing a part of a multicore cable inspection device according to a modified example of the first embodiment.

Here, results of inspecting the correspondence relationship among the ends of the insulated wires 3 by using the respective multicore cable inspection devices of the comparative example and the present embodiment are shown in a table of FIG. 5. In the table of FIG. 5, the inspection result of the comparative example is shown in the second column from the left, and the inspection result of the present embodiment (example) is shown in the third column from the left. In a column of the leftmost item in the table, the insulated wire 3a, the insulated wire 3b, the insulated wire 3c, the insulated wire 3d, the voltage Vmax1, the voltage Vmax2, and the SN ratio are shown in order from the top. The inspection signal VA is inputted to the insulated wire 3a, the first auxiliary signal VB is inputted to the insulated wire 3b, the second auxiliary signal VC is inputted to the insulated wire 3c, and no signal is inputted to the insulated wire 3d.

The two columns on a right side of the item of the insulated wire 3a shown in FIG. 5 are the voltages outputted from the insulated wire 3a when only the switch SW1 shown in FIG. 1 (Example) and FIG. 9 (Comparative Example) is turned on. Similarly, the two columns on a right side of the item of the insulated wire 3b are the voltages outputted from the insulated wire 3b when only the switch SW2 is turned on. Similarly, the two columns on a right side of the item of the insulated wire 3c are the voltages outputted from the insulated wire 3c when only the switch SW3 is turned on. Similarly, the two columns on a right side of the item of the insulated wire 3d are the voltages outputted from the insulated wire 3d when only the switch SW4 is turned on.

The right columns of the voltage Vmax1 shown in the item represent the maximum value of the voltage outputted from the insulated wires 3a to 3d. Further, the right columns of the voltage Vmax2 shown in the item represent the second largest value among the voltages outputted from the insulated wires 3a to 3d. The larger a ratio of the voltage Vmax1 to the voltage Vmax2, the worse the SN ratio and the more difficult it is to specify the correspondence relationship among the insulated wires. The SN ratio is determined by Vmax1/Vmax2.

As shown in FIG. 5, the magnitude of the voltage outputted from the insulated wire 3a, in which the inspection signal VA is inputted, is almost the same in both the comparative example and the embodiment (the present embodiment). However, the value of the voltage Vmax2 in the comparative example is 3.7 µV which is relatively large, whereas the value of the voltage Vmax2 in the example is suppressed to 1.76 µV. Therefore, since the value (4.2) of the example is larger in the SN ratio than the value (2.4) of the comparative example, it is understood that the present embodiment specifies the correspondence relationship among the insulated wires more surely and with higher accuracy than that of the comparative example.

As described above, in the present embodiment, the deterioration of the SN ratio can be suppressed by inputting the plurality of auxiliary signals to the different insulated wires. That is, for example, when the coupling capacitance (capacitance) between the electrode that inputs the first auxiliary signal VB and the insulated wire is lower than the coupling capacitance (capacitance) between the other electrode and the insulated wire, the input impedance increases and the input level of the auxiliary signal decreases. Consequently, the crosstalk reduction effect is reduced and the SN ratio is deteriorated. However, in the present embodiment, since the two or more auxiliary signals are inputted, the auxiliary signals are also inputted from the other electrodes even if the coupling capacitance varies in this way, so that the deterioration in the SN ratio is suppressed. Therefore, in the present embodiment, the reliability of the multicore cable inspection method and the multicore cable inspection device can be improved.

Incidentally, it is also conceivable that, by lengthening the electrodes 41, 61 and increasing an area of contact between each of the electrodes 41, 61 and the insulated wire 3, the coupling capacitance Ca between each of the electrodes 41, 61 and the insulated wire 3 is increased, and the crosstalk between the insulated wires 3 is suppressed. However, in this case, the inspection table and the electrode substrate grow in size. Further, the length of the insulated wire 3 exposed for the inspection becomes long (large), and the extra length of the insulated wire 3 removed at the time of being mounted on a substrate or the like becomes long, so that waste increases. According to the present embodiment, the electrodes 41, 61 are made relatively short, and even when the area of contact between each of the electrodes 41, 61 and the insulated wire 3 is relatively small, the correspondence relationship among the ends of the insulated wires 3 can be identified with good accuracy.

Further, in the present embodiment, since the phase of the auxiliary signal is an antiphase to that of the inspection signal, it is possible to easily generate the auxiliary signal, simplify a circuit configuration, and reduce power consumption.

Modification Example

Although it has been described in FIG. 4 that a flat plate-shaped electrode is used as an electrode to be pressed against the insulated wire 3, a tubular conductor tube surrounding a radial circumference of the insulated wire 3 may be used as the electrode.

A perspective view of FIG. 6 shows: conductor tubes 42, 62, which are parts of a multicore cable inspection device of the present modified example; and the insulated wires 3 constituting the multicore cable used for the inspection. The conductor tubes 42, 62 shown in FIG. 6 can be used in place of the electrodes 41, 61 shown in FIG. 4. The conductor tube 42 is a tubular electrode arranged so as to cover a radial circumference of the input-side end of the insulated wire 3 constituting the multicore cable 2 (see FIG. 4). The conductor tube 62 is a tubular electrode arranged so as to cover a radial circumference of the output-side end of the insulated wire 3 constituting the multicore cable 2. A signal is inputted to the insulated wire 3 by the capacitive coupling via the conductor tube 42, and the signal is outputted via the coupling capacitance between the insulated wire 3 and the conductor tube 62.

In the present embodiment, the tubular conductor tube is used for the electrode capacitively coupled to the insulated wire, and the end of the insulated wire passes through the conductor tube. That is, the inspection signal, first auxiliary signal, and second auxiliary signal are inputted to the plurality of insulated wires by the capacitive coupling via the tubular conductor tube that surrounds each radial circumference of the plurality of insulated wires. Consequently, even if the position of the insulated wire is displaced in the conductor tube, the magnitude of the variations in the coupling capacitance between the conductor tube and the insulated wire is limited within a certain range. Therefore, it is possible to prevent the coupling capacitance between the conductor tube and the insulated wire from excessively resulting variations, so that a more stable inspection can be performed in the multicore cable inspection.

Second Embodiment

Figure 7:
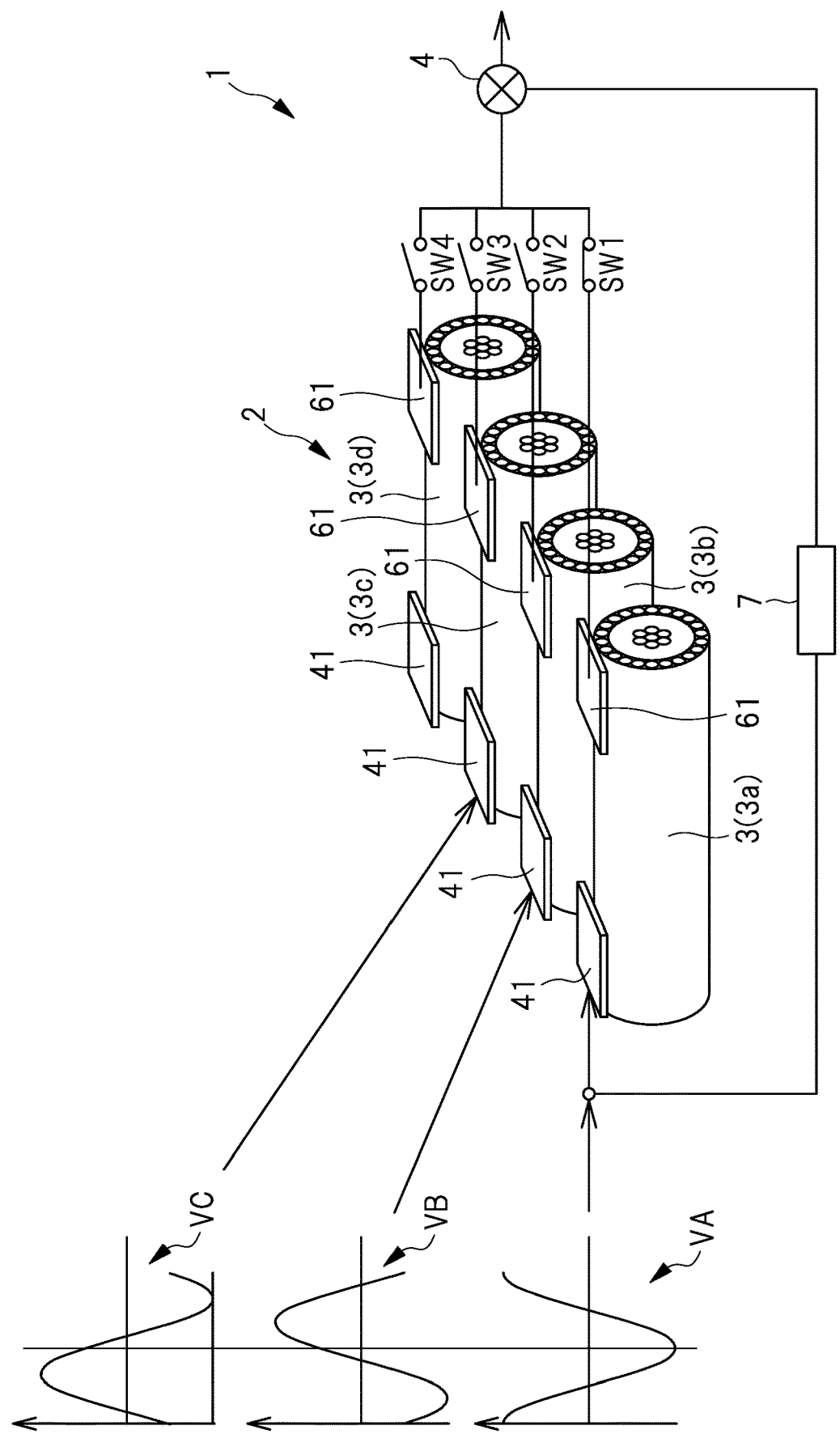
FIG. 7 is a schematic view showing a configuration of a multicore cable inspection device according to a second embodiment.

In the first embodiment, it has been described that the auxiliary signal having a phase opposite to that of the inspection signal is inputted to the plurality of insulated wires. However, here, explained with reference to FIG. 7 will be a case of inputting auxiliary signals in each of which a phase difference with respect to the inspection signal is shifted by $2\pi/(m+1)$ one by one. FIG. 7 is a schematic view showing a configuration of a multicore cable inspection device according to the present embodiment.

The configuration of a multicore cable inspection device 1 of the present embodiment is the same as that of the multicore cable inspection device of the first embodiment. However, a phase and an amplitude of each auxiliary signal are different from those of the first embodiment.

That is, here, as shown in FIG. 7, the inspection signal VA is inputted to the insulated wire 3a; the first auxiliary signal VB is inputted to the insulated wire 3b; the second auxiliary signal VC is inputted to the insulated wire 3c; and no signal is inputted to the insulated wire 3d.

A phase difference between the first auxiliary signal VB and the inspection signal VA is $1 \times 2\pi/3$, and a phase difference between the second auxiliary signal VC and the inspection signal VA is $2 \times 2\pi/3$. That is, when the auxiliary signal is inputted to each of the m insulated wires 3, the phase difference between the auxiliary signal (kth signal, kth signal) inputted to the k-th insulated wire and the inspection signal VA is $k \times 2\pi/(m+1)$. At this time, m is a natural number of 2 or more, and k is a natural number of 1 or more and m or less. Further, unlike the first embodiment, the magnitude of the voltage amplitude of each auxiliary signal is the same as the magnitude of the voltage amplitude of the inspection signal VA regardless of the value of m. Further, the inspection signal VA and each auxiliary signal have the same wavelength as each other.

That is, when three signals of the inspection signal VA, first auxiliary signal VB, and second auxiliary signal VC are inputted to the multicore cable 2, the phase difference between the inspection signal VA and the first auxiliary signal VB, the phase difference between the signal VB and the second auxiliary signal VC, and the phase difference between the second auxiliary signal VC and the inspection signal VA are all $2\pi/3$.

The amplitude of the signal obtained by adding the inspection signal VA and all the auxiliary signals of the first to m-th auxiliary signals becomes smaller than the amplitude of the inspection signal VA. Specifically, the amplitude (voltage, voltage amplitude) of an addition result obtained by adding the amplitude (voltage) of the inspection signal VA at a predetermined point of time and the amplitude (voltage) of all the auxiliary signals of the first to m-th auxiliary signals is zero.

In the multicore cable inspection method according to the present embodiment, the inspection signal is inputted, by the capacitive coupling, to the end of the insulated wire 3 to be inspected among the ends of the insulated wire 3 exposed at the one end of the multicore cable 2. At the same time, here, the auxiliary signals in each of which a phase difference with respect to that of the inspection signal is shifted by $2\pi/(m+1)$ one by one are inputted, by the capacitive coupling, to each of the ends of the m insulated wires 3 of 1st to m-th (n−1≥m≥2) other than the insulated wires 3 to be inspected among the ends of the insulated wires 3 exposed at the one end of the multicore cable 2. Further, the phase difference between the auxiliary signal 3 inputted to the k-th insulated wire 3 among the m insulated wires 3 and the inspection signal is $k \times 2\pi/(m+1)$. Then, the DC component of the signal voltage obtained by multiplying, by the reference signal, the output signal outputted by the capacitive coupling from each end of the insulated wires 3 exposed at the other end of the multicore cable 2 is measured, and the other-side end of the insulated wire 3 to be inspected is specified based on the measured voltage.

In other words, in the present embodiment, each of the m auxiliary signals including the first auxiliary signal and the second auxiliary signal except for the inspection signal is inputted to each of the ends of the m insulated wires 3 other than the insulated wire 3a among the ends of the plurality of insulated wires 3 exposed at the one end of the multicore cable 2. At this time, the phase difference between the inspection signal and the auxiliary signal inputted to the k-th insulated wire 3 of the m insulated wires 3 by an inspection signal input means is $k \times 2\pi/(m+1)$.

By inputting the inspection signal and two or more auxiliary signals, those signals are canceled to each other due to the crosstalk in the other insulated wires 3 that have not inputted those signals. As a result, it is possible to suppress the influence of the crosstalk, and specify the correspondence relationship among the ends of the insulated wires 3 with good accuracy. Therefore, in the present embodiment, the deterioration of the SN ratio is suppressed, so that the reliability of the multicore cable inspection method and the multicore cable inspection device can be improved.

Although the invention made by the present inventors has been specifically described based on the embodiments, the present invention is not limited to the above embodiments and, needless to say, can be variously modified without departing from the scope thereof.

What is claimed is:

1. A multicore cable inspection method of specifying a correspondence relationship among ends of insulated wires exposed at both ends of a multicore cable, the multicore cable being obtained by bundling n insulated wires where n is a natural number of 3 or more and m is a natural number of 2 or more and n−1 or less, the method comprising:
   (a) a step of inputting, by capacitive coupling, an inspection signal to an end of a first insulated wire to be inspected among the ends of the plurality of insulated wires exposed at one end of the multicore cable, and inputting, by the capacitive coupling, each of 1st to m-th signals each having a phase different from that of the inspection signal, to the ends of the m insulated wires other than the first insulated wire among the ends of the insulated wires exposed at the one end of the multicore cable; and
   (b) a step of measuring a voltage of an output signal outputted by the capacitive coupling from each end of the insulated wires exposed at the other end of the multicore cable, and specifying an other-side end of the first insulated wire based on the measured voltage,
   wherein each of the inspection signal and the 1st to m-th signals has the same frequency mutually, and an amplitude of a signal obtained by adding the inspection signal and all the signals of the 1st to m-th signals are smaller than an amplitude of the inspection signal.

2. The multicore cable inspection method according to claim 1,
wherein each of the 1st to m-th signals has a phase opposite to that of the inspection signal.

3. The multicore cable inspection method according to claim 2,
wherein the amplitude of each of the 1st to m-th signals is 1/m of that of the inspection signal.

4. The multicore cable inspection method according to claim 1,
wherein a phase difference between the k-th signal among the 1st to m-th signals and the inspection signal is $k \times 2\pi/(m+1)$, and
wherein k is a natural number of 1 or more and m or less.

5. The multicore cable inspection method according to claim 1,
wherein each of the inspection signal and the 1st to m-th signals is inputted to the plurality of insulated wires by the capacitive coupling via a tubular conductor tube surrounding a radial circumference of each of the plurality of insulated wires.

6. The multicore cable inspection method according to claim 1,
wherein a voltage amplitude of a signal obtained by adding the inspection signal and all the signals of the 1st to m-th signals is zero.

7. The multicore cable inspection method according to claim 1,
wherein the other-side end of the first insulated wire is specified based on a DC component of a voltage of an inspection signal obtained by multiplying an output signal outputted from the ends of the plurality of insulated wires exposed at the other end of the multicore cable by a reference signal having the same phase as that of the output signal of the inspection signal.

8. The multicore cable inspection method according to claim 7,
wherein the end having the largest DC component of the voltage of the detection signal among the ends of the plurality of insulated wires exposed at the other end of the multicore cable is identified as the other-side end of the first insulated wire.

9. The multicore cable inspection method according to claim 1,
wherein it is determined whether or not the insulated wires on the other side corresponding to the ends of the plurality of insulated wires exposed at the one end of the multicore cable have an overlap, and
the insulated wire, which inputs a part or all of the 1st to m-th signals, among the plurality of insulated wires having the overlap is changed, and another correspondence relationship among the ends of the insulated wires is specified again.

10. A multicore cable inspection device that specifies a correspondence relationship among ends of insulated wires exposed at both ends of a multicore cable, the multicore cable being obtained by bundling n insulated wires where n is a natural integer of 3 or more and m is a natural number of 2 or more and n−1 or less, the device comprising:
a first inspection signal input means of inputting, by capacitive coupling, an inspection signal to an end of a first insulated wire to be inspected among the ends of the insulated wires exposed at one end of the multicore cable;
a second inspection signal input means of inputting, by the capacitive coupling, each of 1st to m-th signals, each of which has a phase different from that of the inspection signal, to the ends of the m insulated wires other than the first insulated wire among the ends of the insulated wires exposed at the one end of the multicore cable; and
an arithmetic unit of measuring a voltage of an output signal outputted by the capacitive coupling from each end of the insulated wires exposed at the other end of the multicore cable, and specifying an other-side end of the first insulated wire based on the measured voltage,
wherein each of the inspection signal and the 1st to m-th signals has the same frequency mutually, and
an amplitude of a signal obtained by adding the inspection signal and all the signals of the 1st to m-th signals are smaller than an amplitude of the inspection signal.

11. The multicore cable inspection device according to claim 10,
wherein each of the 1st to m-th signals has a phase opposite to that of the inspection signal.

12. The multicore cable inspection device according to claim 10,
wherein the amplitude of each of the 1st to m-th signals is 1/m of that of the inspection signal.

13. The multicore cable inspection device according to claim 10,
wherein a phase difference between the k-th signal among the 1st to m-th signals and the inspection signal is $k \times 2\pi/(m+1)$, and
wherein k is a natural number of 1 or more and m or less.

14. The multicore cable inspection device according to claim 10,
wherein the first and second inspection signal input means input each of the inspection signal and the 1st to m-th signals to the plurality of insulated wires by the capacitive coupling via a tubular conductor tube surrounding a radial circumference of each of the plurality of insulated wires.

15. The multicore cable inspection device according to claim 10,
wherein a voltage amplitude of a signal obtained by adding the inspection signal and all the signals of the 1st to m-th signals is zero.

16. The multicore cable inspection device according to claim 10,
wherein it is determined whether or not the insulated wires on the other side corresponding to the ends of the plurality of insulated wires exposed at the one end of the multicore cable have an overlap, and
the insulated wire, which inputs a part or all of the 1st to m-th signals, among the plurality of insulated wires having the overlap is changed, and another correspondence relationship among the ends of the insulated wires is specified again.

17. The multicore cable inspection method according to claim 1,
wherein each frequency of the inspection signal and the 1st to m-th signals is smaller than a resonance frequency of the multicore cable.

18. The multicore cable inspection device according to claim 10,
wherein each frequency of the inspection signal and the 1st to m-th signals is smaller than a resonance frequency of the multicore cable.

* * * * *